US010418735B2

(12) United States Patent
Lee et al.

(10) Patent No.: US 10,418,735 B2
(45) Date of Patent: Sep. 17, 2019

(54) MICRO-ELECTRO-MECHANICAL SYSTEMS (MEMS) TERMINAL STRUCTURE OF BOARD-TO-BOARD ELECTRICAL CONNECTOR AND MANUFACTURING METHOD THEREOF

(71) Applicant: ADVANCED-CONNECTEK INC., New Taipei (TW)

(72) Inventors: Kuo-Ching Lee, New Taipei (TW); Ta-Teh Meng, New Taipei (TW); Cheng-Feng Yu, New Taipei (TW)

(73) Assignee: ADVANCED-CONNECTEK INC., New Taipei (TW)

( * ) Notice: Subject to any disclaimer, the term of this patent is extended or adjusted under 35 U.S.C. 154(b) by 0 days.

(21) Appl. No.: 15/961,140

(22) Filed: Apr. 24, 2018

(65) Prior Publication Data

US 2018/0309216 A1    Oct. 25, 2018

Related U.S. Application Data

(60) Provisional application No. 62/488,957, filed on Apr. 24, 2017.

(51) Int. Cl.
*H01R 12/00*    (2006.01)
*H01R 12/85*    (2011.01)
(Continued)

(52) U.S. Cl.
CPC ........... *H01R 12/85* (2013.01); *B81B 3/0054* (2013.01); *B81C 99/0085* (2013.01);
(Continued)

(58) Field of Classification Search
CPC .. H01R 13/111; H01R 13/20; H01R 13/6278; H01R 12/85; H01R 12/73; H01R 12/718;
(Continued)

(56) References Cited

U.S. PATENT DOCUMENTS 4,859,188 A * 8/1989 Neumann ............... H05K 3/326
439/45
5,181,855 A * 1/1993 Mosquera ............... H01R 13/28
439/74
(Continued)

FOREIGN PATENT DOCUMENTS

| CN | 204407560 U | 6/2015 |
| TW | M390581 U | 10/2010 |
| TW | M443284 U | 12/2012 |

OTHER PUBLICATIONS

Office Action issued in corresponding Taiwan patent application dated Sep. 6, 2018.

*Primary Examiner* — Abdullah A Riyami
*Assistant Examiner* — Vladimir Imas
(74) *Attorney, Agent, or Firm* — Muncy, Geissler, Olds & Lowe, P.C.

(57) ABSTRACT

A micro-electro-mechanical systems (MEMS) terminal structure of board-to-board electrical connector and manufacturing method thereof are provided. The terminal of the terminal structure includes a side arm, a bent portion, and a flexible arm integrally formed as one component. The flexible arm includes a first portion and a second portion. The first portion and the side arm form an insertion space. The second portion and the side arm form a locking space. The second portion of the flexible arm has a contact portion. The insertion space is greater than the locking space. The terminal has curved and locking features to extend the moment arm of the terminal for improving the terminal flexibility. The terminal contacts a mating terminal through multiple points, thereby improving the contact stability and providing the locking function. Furthermore, by using the MEMS techniques for semiconductor industries, the terminal of micro board-to-board electrical connector can be manufactured.

10 Claims, 13 Drawing Sheets

(51) Int. Cl.
*B81B 3/00* (2006.01)
*B81C 99/00* (2010.01)
*H01R 13/115* (2006.01)
*H01R 13/627* (2006.01)
*H01R 43/16* (2006.01)
*H01R 12/73* (2011.01)
*H01R 12/71* (2011.01)
*H01R 13/20* (2006.01)
*H01R 13/11* (2006.01)

(52) U.S. Cl.
CPC .......... *H01R 12/73* (2013.01); *H01R 13/115* (2013.01); *H01R 13/6278* (2013.01); *H01R 43/16* (2013.01); *B81B 2201/014* (2013.01); *B81C 2201/032* (2013.01); *H01R 12/718* (2013.01); *H01R 13/111* (2013.01); *H01R 13/20* (2013.01)

(58) Field of Classification Search
CPC ..... H01R 43/16; H01R 13/115; B81B 3/0054; B81B 2201/014; B81C 99/0085; B81C 2201/032
USPC .......................................................... 439/75
See application file for complete search history.

(56) References Cited

U.S. PATENT DOCUMENTS

| | | | | |
|---|---|---|---|---|
| 5,575,688 A * | 11/1996 | Crane, Jr. | ............... | H01R 13/26 439/268 |
| 5,634,821 A * | 6/1997 | Crane, Jr. | ............... | H01R 13/26 439/660 |
| 5,641,309 A * | 6/1997 | Crane, Jr. | ............... | H01R 13/26 439/660 |
| 5,951,320 A * | 9/1999 | Crane, Jr. | ............... | H01R 13/26 439/405 |
| 6,093,035 A * | 7/2000 | Lemke | ............... | H01R 43/0256 439/83 |
| 6,193,537 B1 * | 2/2001 | Harper, Jr. | ............. | H01R 13/28 439/291 |
| 6,667,627 B2 * | 12/2003 | Tanioka | ............. | G01R 1/07378 29/842 |
| 6,781,845 B2 * | 8/2004 | Chang | ................... | H05K 3/368 361/736 |
| 6,846,187 B2 * | 1/2005 | Yu | ......................... | H01R 13/20 439/346 |
| 6,926,538 B2 * | 8/2005 | Ma | ........................ | H01R 13/26 439/74 |
| 6,951,465 B2 * | 10/2005 | Sweetland | ........... | H01R 13/052 439/329 |
| 7,179,095 B1 * | 2/2007 | Peng | .................. | H01R 12/7052 439/290 |
| 7,329,129 B2 * | 2/2008 | Soeta | ................. | G01R 31/2863 439/66 |
| 7,674,135 B2 * | 3/2010 | Zeng | ...................... | H01R 13/26 439/660 |
| 8,092,232 B2 * | 1/2012 | Takeuchi | ............ | H01R 12/716 439/74 |
| 8,277,241 B2 * | 10/2012 | Horchler | ................ | H01R 24/84 439/295 |
| 8,545,277 B2 | 10/2013 | Ondusko et al. | | |
| 8,784,145 B2 * | 7/2014 | Koyama | ................ | H01R 13/2464 439/500 |
| 8,998,645 B2 * | 4/2015 | Vanaleck | ............... | H01R 13/28 439/626 |
| 9,147,969 B2 * | 9/2015 | Takenaga | ............ | H01R 13/6275 |
| 9,220,163 B2 * | 12/2015 | Hashiguchi | ............ | H01R 12/73 |
| 9,437,950 B2 * | 9/2016 | Koguchi | ............. | H01R 12/716 |
| 9,742,081 B1 * | 8/2017 | Annis | .................. | H01R 12/585 |
| 9,787,044 B2 * | 10/2017 | Hashiguchi | ............ | H01R 12/73 |
| 9,871,323 B2 * | 1/2018 | Horchler | ................ | H01R 13/64 |
| 9,893,480 B2 * | 2/2018 | Kodaira | ................ | H01R 24/60 |
| 2005/0020109 A1 * | 1/2005 | Raistrick | ............... | H01R 13/26 439/108 |
| 2012/0238148 A1 * | 9/2012 | Lee | ..................... | H01R 13/6587 439/660 |
| 2014/0017957 A1 * | 1/2014 | Horchler | ................ | H01R 13/64 439/680 |
| 2015/0214643 A1 * | 7/2015 | Lee | .................... | H01R 12/0729 439/655 |
| 2017/0040720 A1 * | 2/2017 | Lee | ........................ | H01R 12/73 |

* cited by examiner

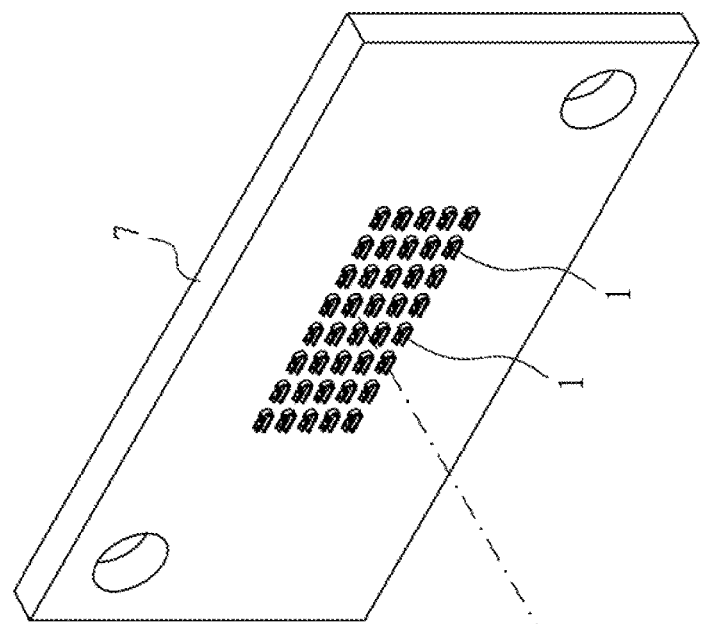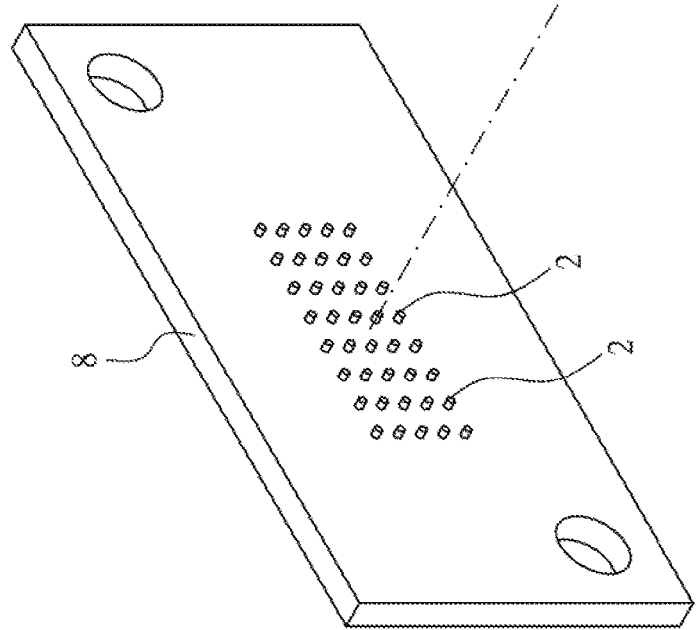
Fig. 2

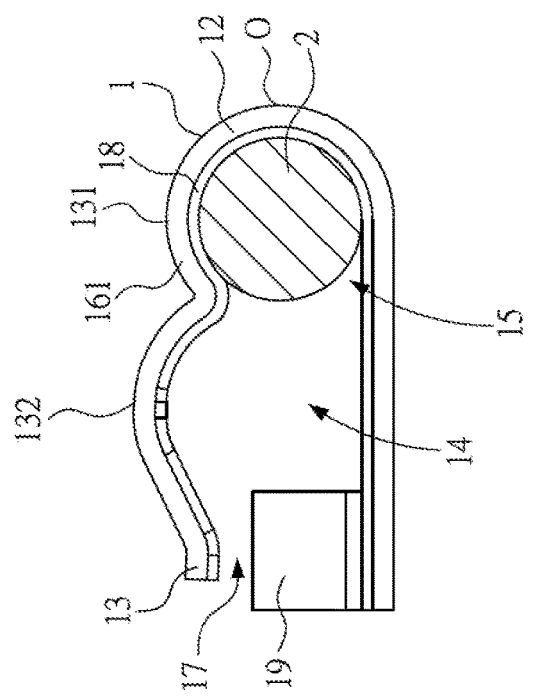
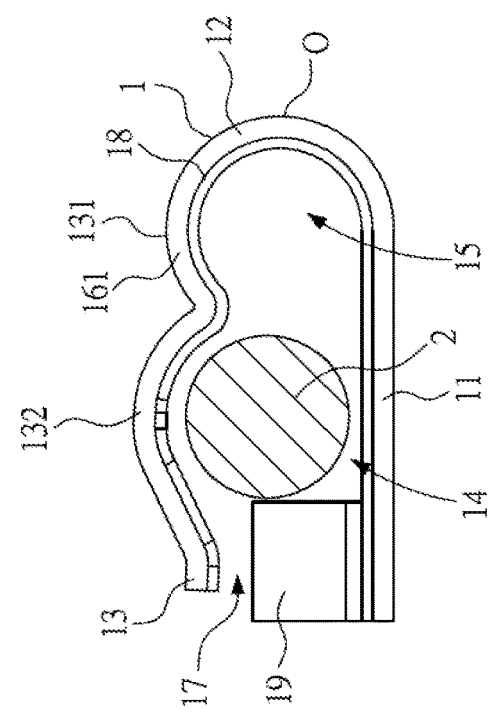

Transmitting a terminal shape to a surface of a thick coated layer through a mask and applying lights on the mask to form a recess with a profile of the terminal shape, forming a terminal of a board-to-board electrical connector in the recess by electrocasting, wherein the terminal comprises a side arm, a bent portion, and a flexible arm stacked with each other to form a three-dimensional structure. ~S810

Fig. 9A

MICRO-ELECTRO-MECHANICAL SYSTEMS (MEMS) TERMINAL STRUCTURE OF BOARD-TO-BOARD ELECTRICAL CONNECTOR AND MANUFACTURING METHOD THEREOF

CROSS-REFERENCE TO RELATED APPLICATION

This non-provisional application claims priority under 35 U.S.C. § 119(e) to U.S. Provisional Patent Application No. 62/488,957, filed on Apr. 24, 2017, the entire contents of which are hereby incorporated by reference.

FIELD OF THE INVENTION

The instant disclosure relates to a terminal structure, and more particular to a micro-electro-mechanical systems (MEMS) terminal structure of board-to-board electrical connector and manufacturing method thereof.

BACKGROUND

Electrical devices, especially portable products, tend to become smaller, thinner, and lighter. An electrical device usually comprises different circuit boards therein which need to be electrically connected to each other. In order to improve the utilization rate of space inside the electrical device, different circuit boards are usually applied with a board-to-board (BTB) electrical connector for electrical connection.

The BTB electrical connector is an electrical connector assembly. In general, the electrical connector assembly comprises a plug connector and a receptacle connector corresponding to the plug connector. A plurality of terminals is arranged on the receptacle connector, and a plurality of columnar terminals is arranged on the plug connector. When the plug connector is mated with the receptacle connector, the columnar terminals are mated with the terminals for the signal connection between two printed circuit boards.

SUMMARY OF THE INVENTION

A conventional terminal (i.e., receptacle terminal) is a U-shape clamping structure. When the columnar terminal (i.e., plug terminal) is inserted into and mated with the conventional terminal, the user has to exert a greater force to insert the columnar terminal into the conventional terminal. Hence, the conventional terminal cannot be utilized in a convenient manner. Moreover, when the clamping structure of the conventional terminal is mated with the columnar terminal frequently, the conventional terminal would be deformed or broken easily.

In view of this, an embodiment of the instant disclosure provides a micro-electro-mechanical systems (MEMS) terminal structure of board-to-board electrical connector. The terminal structure comprises a terminal assembled on a surface of a first plate member. The terminal comprises a side arm in which a portion of the side arm is spaced from the surface of the first plate member by a distance, a bent portion formed on a first end of the side arm, and a flexible arm formed on an end portion of the bent portion and located at a side portion of the side arm. The flexible arm comprises a first portion and a second portion. The first portion and the side arm form an insertion space. The second portion and the side arm form a locking space. The second portion of the flexible arm has a contact portion. The insertion space is greater than the locking space.

In some embodiments, the MEMS terminal structure further comprises a columnar terminal assembled on a second plate member for mating with the terminal. A first side of the columnar terminal is in contact with the contact portion, a second side of the columnar terminal opposite to the first side is in contact with the side arm, and the columnar terminal is locked in the locking space.

In some embodiments, the contact portion is a curved structure and in contact with the first side of the columnar terminal.

In some embodiments, the curved structure is in contact with the first side of the columnar terminal with two points or with a surface.

In some embodiments, the flexible arm is flexibly swingable with the first end of the side arm as a fulcrum.

In some embodiments, an opening is formed between the flexible arm and a second end of the side arm opposite to the first end. The locking space is adjacent the opening, and the insertion space is located inside the bent portion.

In some embodiments, an opening is formed between the flexible arm and a second end of the side arm opposite to the first end. The insertion space is adjacent the opening, and the locking space is located inside the bent portion.

In some embodiments, the terminal comprises a guiding portion formed on a periphery of the side arm and a periphery of the flexible arm.

In some embodiments, the terminal comprises a contact leg outwardly extending from the second end of the side arm.

Another embodiment of the instant disclosure provides a method of manufacturing micro-electro-mechanical systems (MEMS) terminal structure of board-to-board electrical connector. The method comprises following steps.

Transmit a terminal shape to a surface of a thick coated layer through a mask, apply lights on the mask to form a recess with a profile of the terminal shape on the thick coated layer, and form a terminal of a board-to-board electrical connector in the recess by electrocasting. The terminal comprises a side arm, a bent portion, and a flexible arm stacked with each other to form a three-dimensional structure.

As above, according to some embodiment of the instant disclosure, the terminal has a plurality of curved features and locking features to extend the moment arm of the terminal for improving the flexibility of the terminal. The terminal is in contact with the columnar terminal through multiple points (or through the point and the surface), thereby improving the contact stability as well as providing the locking function. Furthermore, by using the MEMS techniques for semiconductor industries, the terminal (female terminal) of micro board-to-board electrical connector can be manufactured; while the terminal of the conventional board-to-board electrical connector is manufactured by stamping or etching which cannot be further minimized. As a result, the application of the terminal of the conventional board-to-board electrical connector is rather limited.

Detailed description of the characteristics and the advantages of the instant disclosure are shown in the following embodiments. The technical content and the implementation of the instant disclosure should be readily apparent to any person skilled in the art from the detailed description, and the purposes and the advantages of the instant disclosure should be readily understood by any person skilled in the art with reference to content, claims, and drawings in the instant disclosure.

BRIEF DESCRIPTION OF THE DRAWINGS

The instant disclosure will become more fully understood from the detailed description given herein below for illustration only, and thus not limitative of the instant disclosure, wherein:

FIG. 2 illustrates an exploded view of the board-to-board electrical connector assembly;

FIG. 7 illustrates a cross-sectional view showing that the terminal is mating with the columnar terminal, according to a second embodiment of the instant disclosure;

FIG. 8 illustrates a cross-sectional view showing that the terminal is mated with the columnar terminal, according to the second embodiment;

FIG. 9A illustrates a flowchart (1) showing a manufacturing method of a micro-electro-mechanical systems (MEMS) terminal structure of board-to-board electrical connector of an exemplary embodiment of the instant disclosure;

DETAILED DESCRIPTION

Figure 1:
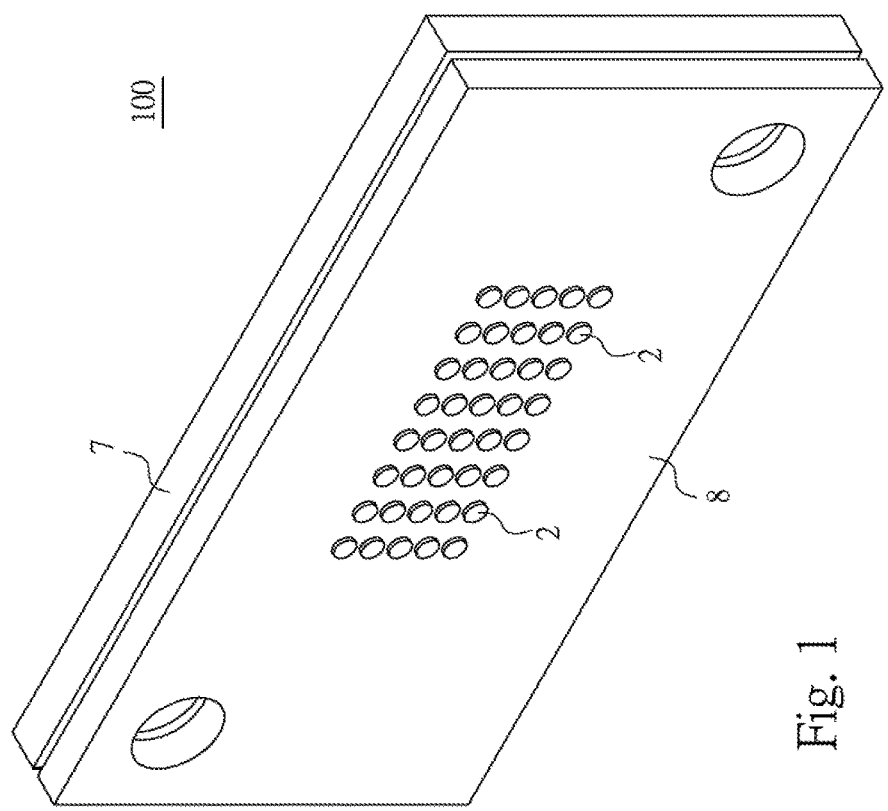
FIG. 1 illustrates a perspective view of a board-to-board electrical connector assembly of an exemplary embodiment of the instant disclosure.
Figure 3:
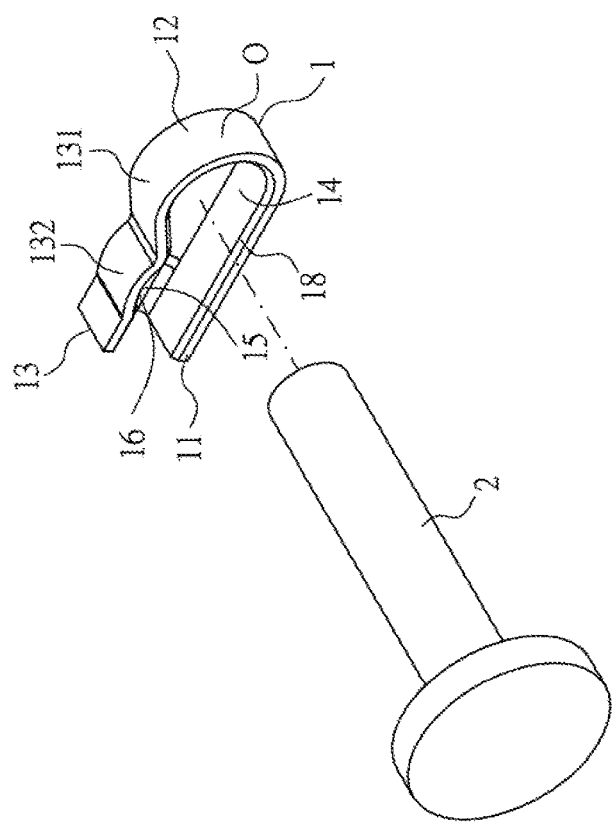
FIG. 3 illustrates an exploded view of a terminal and a columnar terminal, according to a first embodiment of the instant disclosure.

Please refer to FIGS. 1 to 3, illustrating a board-to-board (BTB) electrical connector assembly 100 of an exemplary embodiment of the instant disclosure. FIG. 1 illustrates a perspective view of the board-to-board electrical connector assembly. FIG. 2 illustrates an exploded view of the board-to-board electrical connector assembly. FIG. 3 illustrates an exploded view of a terminal and a columnar terminal, according to a first embodiment of the instant disclosure. In this embodiment, the board-to-board electrical connector assembly 100 comprises a terminal 1 (i.e., receptacle terminal) held on a first plate member 7 and a columnar terminal 2 (i.e., plug terminal) held on a second plate member 8. The terminal 1 is a female terminal, the columnar terminal 2 is a male terminal, and the columnar terminal 2 is inserted into the terminal 1.

Figure 4:
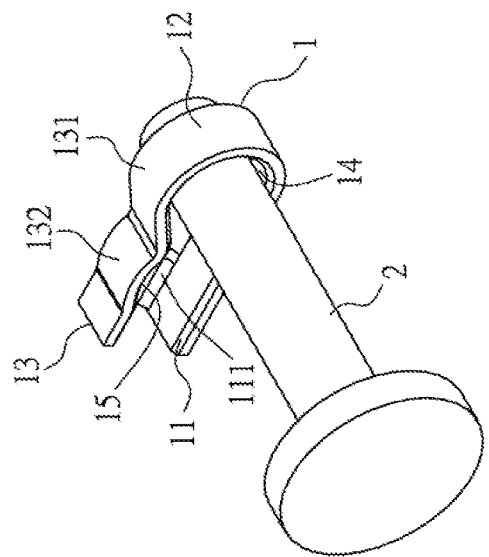
FIG. 4 illustrates an assembled view of the terminal and the columnar terminal, according to the first embodiment.
Figure 5:
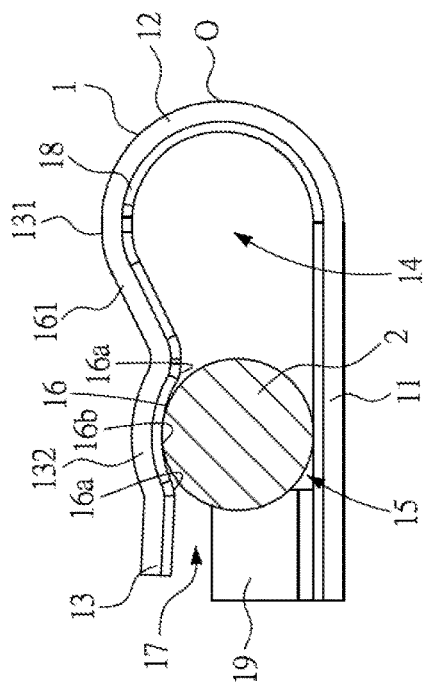
FIG. 5 illustrates a cross-sectional view showing that the terminal is mating with the columnar terminal, according to the first embodiment.
Figure 6:
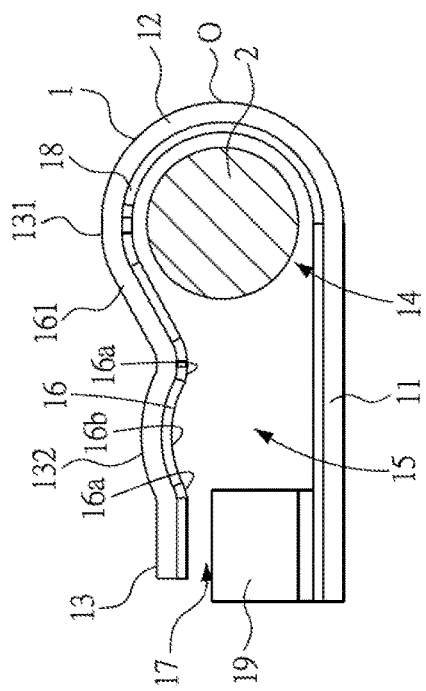
FIG. 6 illustrates a cross-sectional view showing that the terminal is mated with the columnar terminal, according to the first embodiment.

Please refer to FIGS. 2 to 6. FIG. 4 illustrates an assembled view of the terminal 1 and the columnar terminal 2. FIG. 5 illustrates a cross-sectional view showing that the terminal 1 is mating with the columnar terminal 2. FIG. 6 illustrates a cross-sectional view showing that the terminal 1 is mated with the columnar terminal 2. In this embodiment, the terminal 1 comprises a side arm 11, a bent portion 12, and a flexible arm 13. The bent portion 12 is formed on a first end of the side arm 11. The flexible arm 13 is formed on an end portion of the bent portion 12 and located at a side portion of the side arm 11. A distance 17 is between the flexible arm 13 and the side arm 11. In other words, the side arm 11 and the flexible arm 13 are approximately arranged in a side-by-side manner, and a top view of the flexible arm 13 and the side arm 11 is U-shape.

Please refer to FIGS. 2 to 6. The flexible arm 13 comprises a first portion 131 and a second portion 132. The first portion 131 and the side arm 11 form an insertion space 14. The second portion 132 and the side arm 11 form a locking space 15. The second portion 132 of the flexible arm 13 has a contact portion 16. A first side of the columnar terminal 2 is in contact with the contact portion 16, a second side of the columnar terminal 2 opposite to the first side is in contact with the side arm 11, and the columnar terminal 2 is locked in the locking space 15.

Please refer to FIGS. 2 to 6. The terminal 1 comprises a contact leg 19 formed on a second end of the side arm 11, wherein the second end is opposite to the first end. When the terminal 1 is manufactured by MEMS technologies, the terminal 1 is a stacked structure in which the contact leg 19 of the terminal 1 is connected to the first plate member 7. In this embodiment, an extension portion 111 is extended from a bottom of the side arm 11 for contacting the first plate member 7. When the terminal 1 is assembled on the surface of the first plate member 7, the side arm 11 and the surface of the first plate member 7 is spaced via the extension portion 111 (as shown in FIGS. 2 and 4).

Please refer to FIGS. 2 to 6. In this embodiment, a width of the insertion space 14 is greater than a width of the locking space 15, the width of the insertion space 14 is greater than an outer diameter of the columnar terminal 2, and the width of the locking space 15 is less than the outer diameter of the columnar terminal 2. When the columnar terminal 2 is inserted into the insertion space 14, an outer surface of the columnar terminal 2 is not interfered by the side arm 11 or the flexible arm 13 neighboring the insertion space 14. In other words, the columnar terminal 2 can be inserted into the insertion space 14 without applying insertion force. Therefore, the connection between the terminal 1 and the columnar terminal 2 can be achieved in a convenient manner.

Please refer to FIGS. 2 to 6. In this embodiment, the first portion 131 and the second portion 132 of the flexible arm 13 form a multi-sectioned arc structure 161. In other words, the flexible arm 13 of the terminal 1 has a plurality of curved features and locking features to extend the moment arm of the terminal for improving the flexibility of the terminal.

Please refer to FIGS. 2 to 6. In this embodiment, the first side of the columnar terminal 2 is in contact with the contact portion 16, the second side of the columnar terminal 2 is in contact with the side arm 11, and the columnar terminal 2 is locked in the locking space 15. In this embodiment, the columnar terminal 2 is firstly inserted into the insertion space 14. Next, the columnar terminal 2 is moved laterally and locked in the locking space 15, and the flexible arm 13 is flexibly swingable with the first end of the side arm 11 as a fulcrum. In this embodiment, the columnar terminal 2 is laterally moved and locked in the locking space 15 of the terminal 1, but embodiments are not limited thereto. In one embodiment, the columnar terminal 2 is vertically moved and locked in the locking space 15 of the terminal 1, and the terminal 1 is of a V-shape; that is, the upper portion of the terminal 1 has an insertion space 14 while the lower portion of the terminal 1 has a locking space 15.

Please refer to FIGS. 2 to 6. The columnar terminal 2 with a cylindrical shape allows the signal transmission to be performed properly when the terminal 1 is mated with the columnar terminal 2. The terminal 1 is designed to have a curved profile. Hence, when the columnar terminal 2 is inserted into the terminal 1, the columnar terminal 2 is not interfered by the terminal 1 (i.e., zero interfering force, ZIF). Further, the columnar terminal 2 is mated with the terminal 1 by a two-step movement operation. In the first-step movement, the columnar terminal 2 is moved to contact the first portion 131 of the terminal 1, and the user may feel apparent feedback from the contact. Next, in the second-step movement, the columnar terminal 2 is locked in the locking space 15 and in contact with the points 16a and surfaces 16b of the terminal 1. Furthermore, the terminal 1 comprises a guiding portion 18 formed on a periphery of the side arm 11 and a periphery of the flexible arm 13. The guiding portion 18 is a chamfered structure for guiding the columnar terminal 2 to be inserted into the insertion space 14 conveniently.

Please refer to FIGS. 2 to 6. In this embodiment, the contact portion 16 of the terminal 1 is an arc structure 161 contacting the first side of the columnar terminal 2. The arc structure 161 is in contact with the first side of the columnar terminal 2 by two points 16a or by a surface 16b. In this embodiment, after the board to board electrical plug connector is mated with the board to board electrical receptacle connector, the head portion of the columnar terminal 2 is inserted into the terminal 1 without applying insertion force. In the first-step movement, the columnar terminal 2 is moved to contact the first portion 131 of the terminal 1 and the user may feel feedback from the contact. When the columnar terminal 2 is further moved to the second portion 132 of the terminal 1, the columnar terminal 2 is locked by contacting three points 16a of the terminal 1; that is, a bottom portion of the columnar terminal 2 is in contact with the terminal 1 via one point 16a, and two sides of a top portion of the columnar terminal 2 are in contact with the terminal 1 via two points 16a, but embodiments are not limited thereto. In one embodiment, the curvature of the terminal 1 may be mated with the curvature of the columnar terminal 2, namely, the columnar terminal 2 is locked by contacting one point 16a and one surface 16b; that is, the bottom portion of the columnar terminal 2 is in contact with the terminal 1 via one point 16a, and the top portion of the columnar terminal 2 is in contact with the terminal 1 via one surface 16b.

Please refer to FIGS. 5 and 6. In this embodiment, the insertion space 14 is at the first end of the side arm 11, and the locking space 15 is at the second end of the side arm 11. In other words, the insertion space 14 is at interior of the terminal 1 in an approximate U-shape while the locking space 15 is at an opening near the U-shape structure of the terminal 1, but embodiments are not limited thereto.

Please refer to FIGS. 7 and 8. FIG. 7 illustrates a cross-sectional view showing that the terminal 1 is mating with the columnar terminal 2 and FIG. 8 illustrates a cross-sectional view showing that the terminal 1 is mated with the columnar terminal 2, according to a second embodiment of the instant disclosure. The difference between the first embodiment and this embodiment is that positions of the insertion space 14 and the locking space 15 are exchanged, so that the structure of the terminal 1 is changed correspondingly. In other words, in the second embodiment, the insertion space 14 of the terminal 1 is located at the second side of the side arm 11, and the locking space 15 is located at the first side of the side arm 11. That is, the locking space 15 is at interior of the terminal 1 in an approximate U-shape while the insertion space 14 is at an opening near the U-shape structure of the terminal 1. Hence, the columnar terminal 2 is firstly inserted into the insertion space 14 which is rather wider, and then the columnar terminal 2 is laterally moved to be locked in the locking space 15 which is rather narrower. In this case, since the locking space 15 is located at the interior of the U-shape structure of the terminal 1, the columnar terminal 2 would be clamped by a greater clamping force.

Figure 9B:
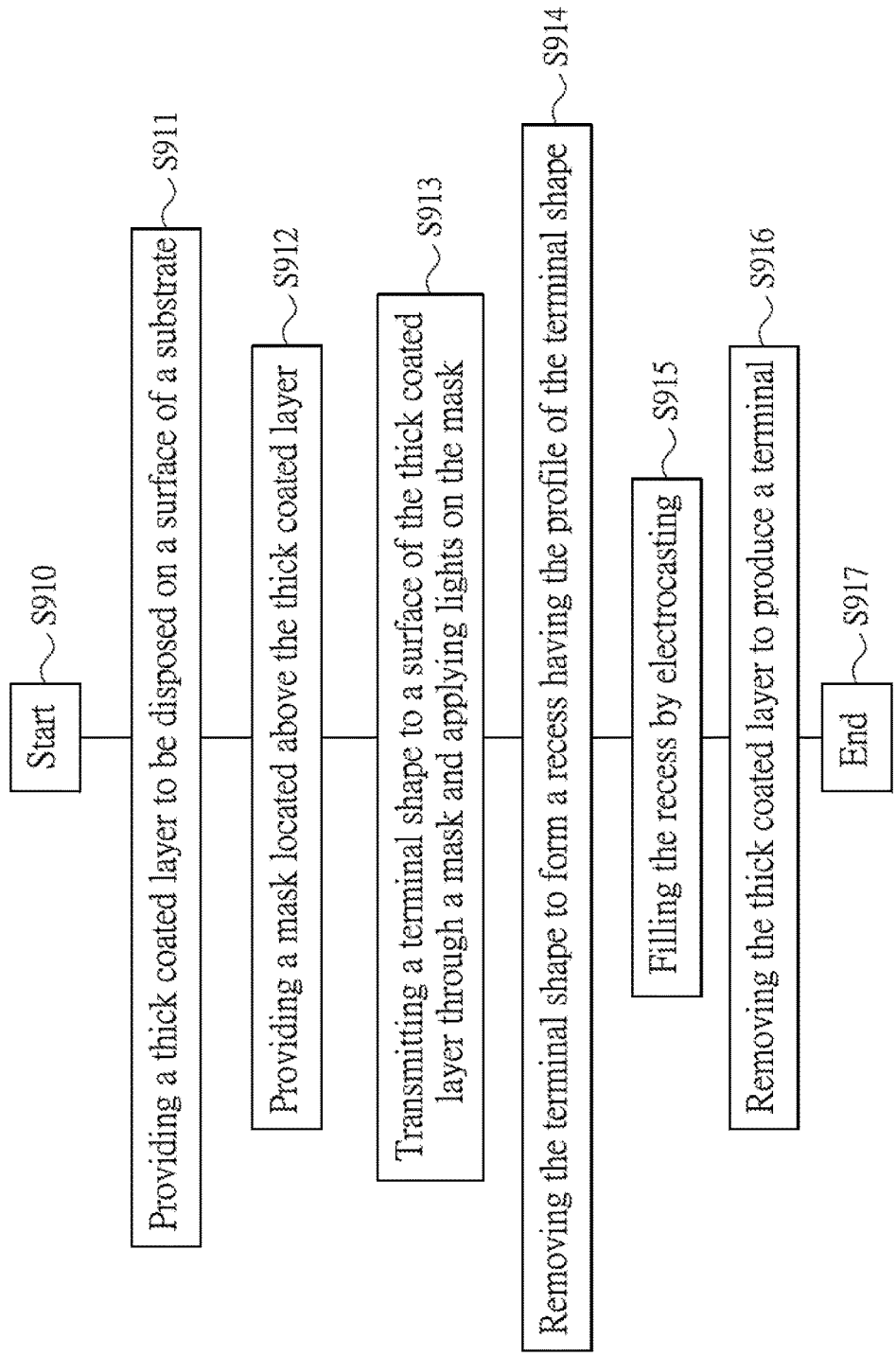
FIG. 9B illustrates a flowchart (2) showing a manufacturing method of a micro-electro-mechanical systems (MEMS) terminal structure of board-to-board electrical connector of an exemplary embodiment of the instant disclosure.
Figure 10:
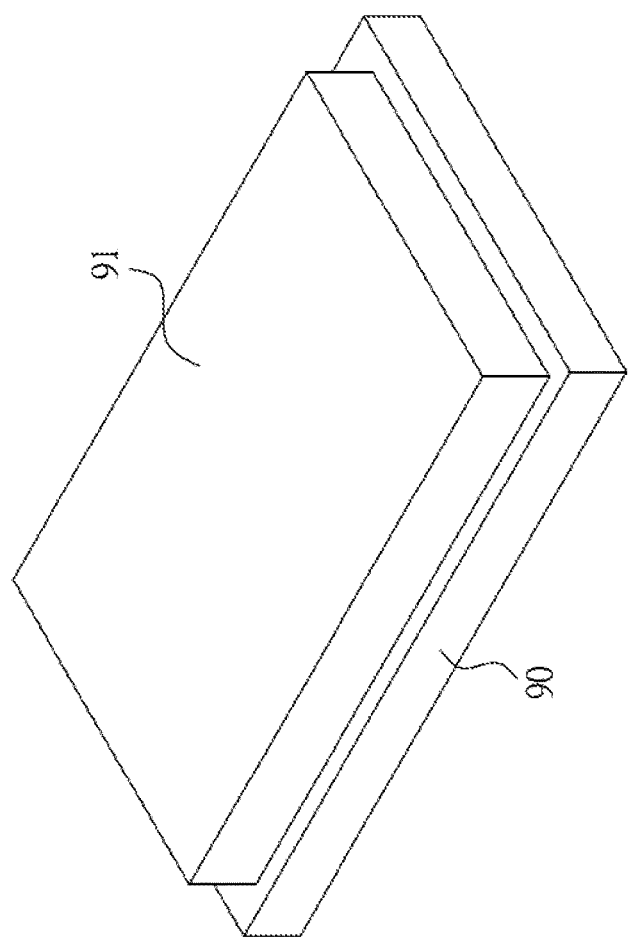
FIG. 10 illustrates a schematic view (1) of the manufacturing method of the MEMS terminal structure.
Figure 11:
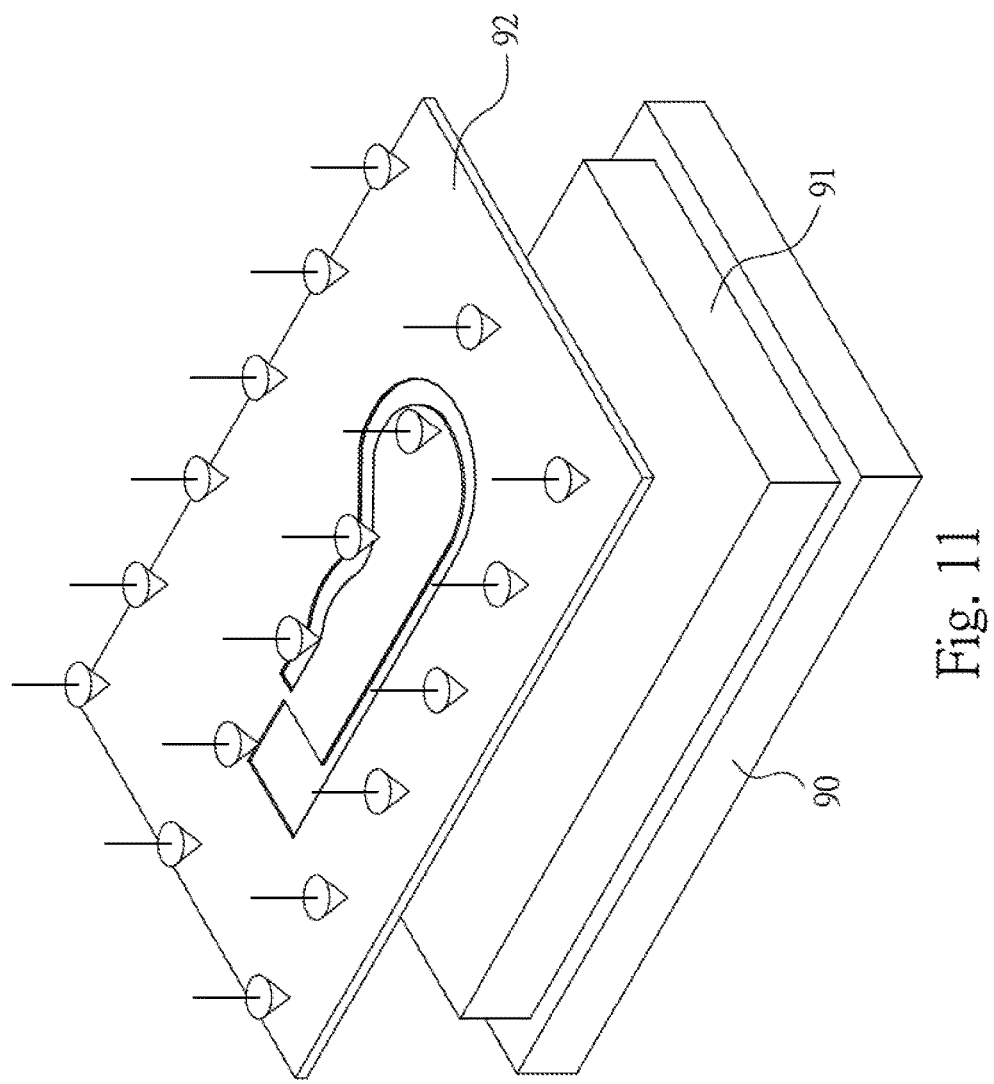
FIG. 11 illustrates a schematic view (2) of the manufacturing method of the MEMS terminal structure.
Figure 12:
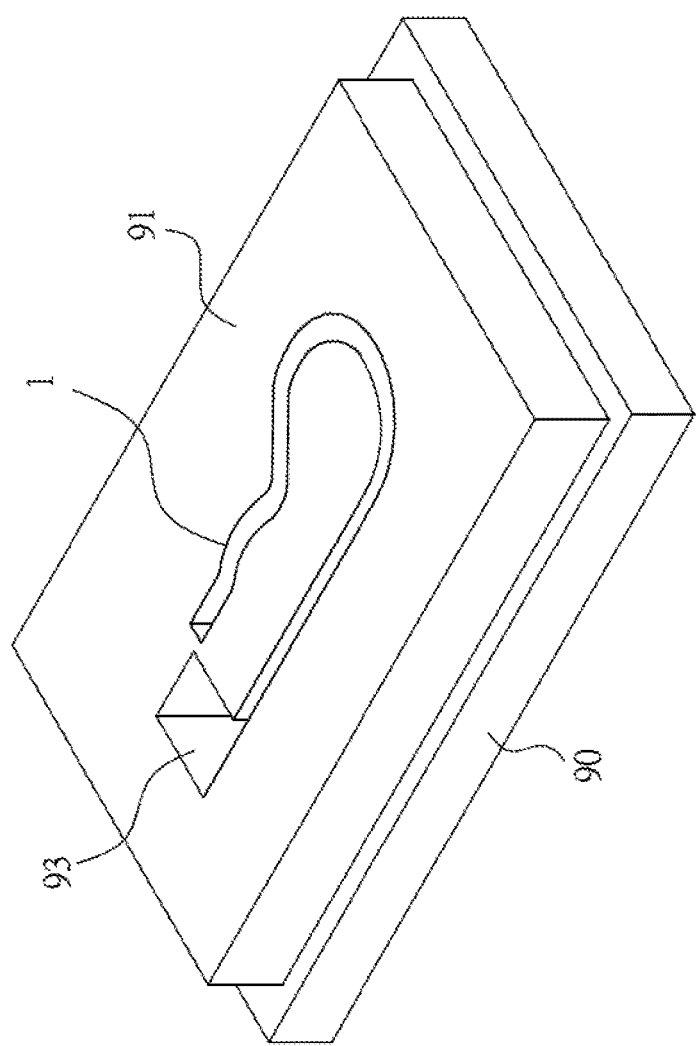
FIG. 12 illustrates a schematic view (3) of the manufacturing method of the MEMS terminal structure.
Figure 13:
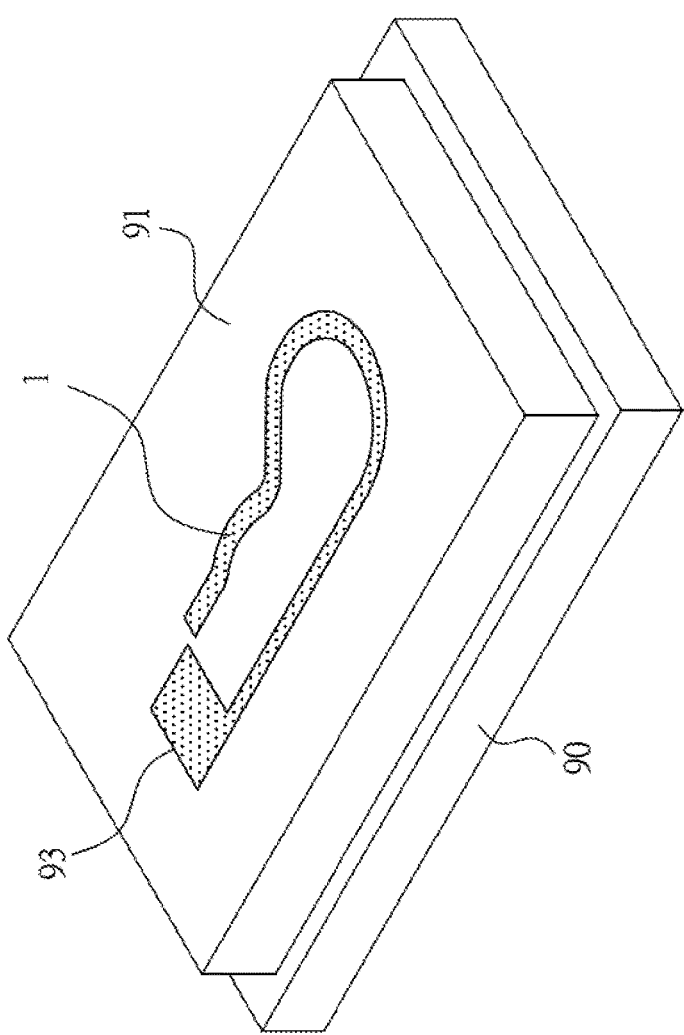
FIG. 13 illustrates a schematic view (4) of the manufacturing method of the MEMS terminal structure.
Figure 14:
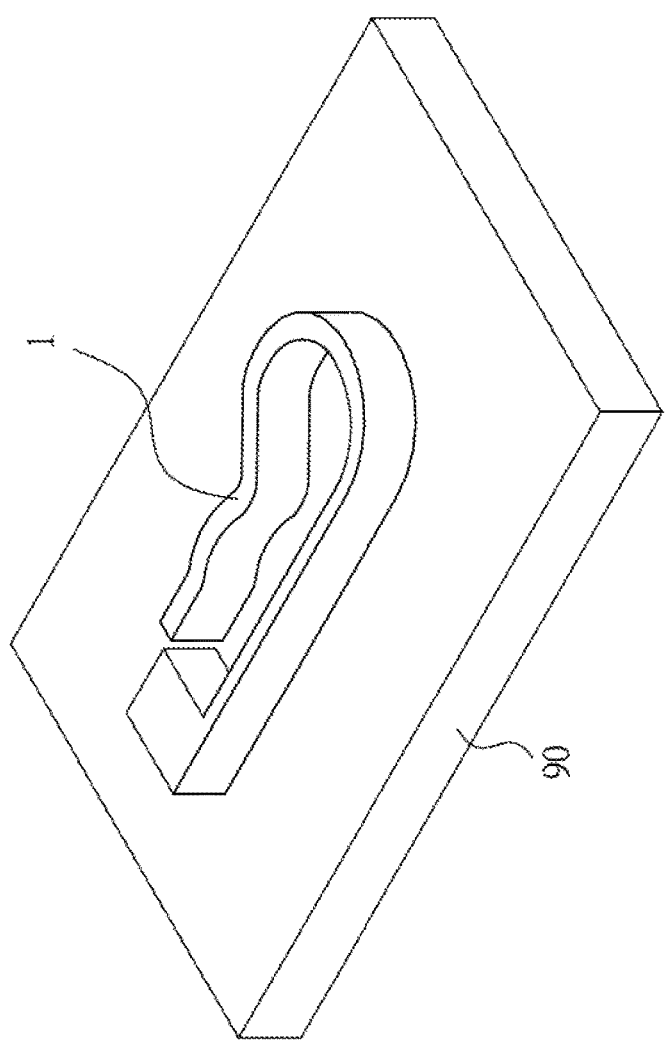
FIG. 14 illustrates a schematic view (5) of the manufacturing method of the MEMS terminal structure.
Figure 15:
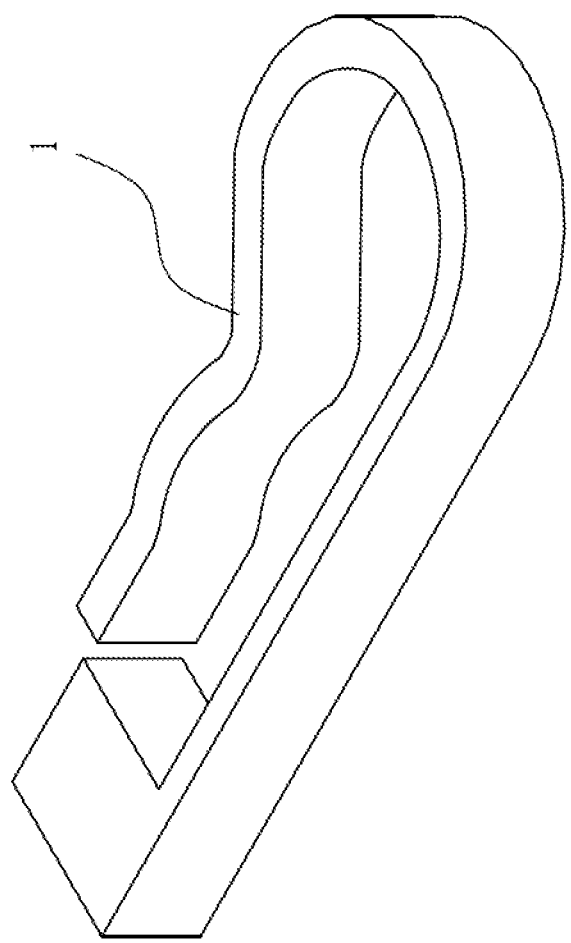
FIG. 15 illustrates a schematic view (6) of the manufacturing method of the MEMS terminal structure.

Please refer to FIGS. 9A and 9B. FIG. 9A illustrates a flowchart (1) showing a manufacturing method of a MEMS terminal structure of a board-to-board electrical connector and FIG. 9B illustrates a flowchart (2) showing a manufacturing method of a MEMS terminal structure of the board-to-board electrical connector, according to an exemplary embodiment of the instant disclosure. A manufacturing method of a MEMS terminal structure of a board-to-board electrical connector includes following steps.

Step S810, transmitting a terminal shape to a surface of a thick coated layer 91 through a mask 92 and applying lights on the mask 92 to form a recess 93 with a profile of the terminal shape, forming a terminal 1 of a board-to-board electrical connector in the recess 93 by electrocasting, wherein the terminal 1 comprises a side arm 11, a bent portion 12, and a flexible arm 13 stacked with each other to form a three-dimensional structure.

Specifically, the step S810 further has following steps.
Step S910, start.
Step S911, providing the thick coated layer 91 to be disposed on a surface of a substrate 90.
Step S912, providing the mask 92 located above the thick coated layer 91.
Step S913, transmitting the terminal shape to the surface of the thick coated layer 91 through the mask 92 and applying lights on the mask 92.
Step S914, removing the terminal shape to form the recess 93 having the profile of the terminal shape.
Step S915, filling the recess 93 by electrocasting.
Step S916, removing the thick coated layer 91 to produce the terminal 1.
Step S917, end.

Please refer to FIGS. 10 to 15, illustrating schematic views of the manufacturing method of the MEMS terminal structure. In this embodiment, a thick coated layer 91 (photoresists, PR) is disposed on a surface of a substrate 90 and a mask 92 is formed. And, the geometrical pattern shape of the terminal 1 is transmitted on the surface of the thick coated layer 91 through the mask 92. Next, the mask 92 is illuminated by lights and the photoresists are exposed. Then, the geometrical shape of the terminal 1 is removed and the recess 93 having the geometrical shape of the terminal 1 is formed. Then, the recess 93 having the geometrical shape of the terminal 1 is filled by using electrocasting approaches. Next, the thick coated layer 91 is removed to produce a semi-product of the terminal 1. The terminal 1 is formed by using MEMS techniques. In other words, the thick coated layer 91 is manufactured by molds firstly, and then the recess

93 having the shape of the terminal 1 is formed via lights, next the recess 93 is filled and the thick coated layer 91 is removed to form the semi-product of the terminal 1. Through different masks, the semi-product of the terminal structure can be manufactured. In brief, the respective processing steps are thick photoresists (PR) coating, lithography, developing, electrocasting, photoresists (PR) stripping, and product releasing.

In this embodiment, through MEMS (to form integrated micro components or systems) related techniques, the bent-shape terminal 1 is formed (as shown in FIGS. 2 to 6) by stacking using metallic materials and positioned on the first plate member 7. The terminal 1 has a plurality of curved features and locking features to extend the moment arm of the terminal 1 for improving the flexibility of the terminal 1. The terminal 1 is in contact with the columnar terminal 2 through multiple points 16a (or through the point 16a and the surface 16b), thereby improving the contact stability as well as providing the locking function. In other words, by using the MEMS techniques for semiconductor industries, the terminal 1 (female terminal) of micro board-to-board electrical connector can be manufactured; while the terminal of the conventional board-to-board electrical connector is manufactured by stamping or etching, and the size of such terminal is about 1 mm, which cannot be further minimized. As a result, the application of the terminal of the conventional board-to-board electrical connector is rather limited.

In the MEMS techniques, electrical and mechanical components manufactured by IC processing technologies are utilized, in which the size of the component or the system about from 1 μm ($10^{-6}$ m) to 1 mm ($10^{-3}$ m). Hence, MEMS terminal structures with minimized size for board to board electrical connector can be manufactured.

MEMS related techniques are technologies that combine semiconductor processing techniques and precision machinery techniques for manufacturing tiny components as well as function-integrated microsystems. The semiconductor processing techniques may be roughly classified into three categories: (1) thin film growth, (2) lithography and exposure, and (3) etching and formation. The manufacturing techniques of MEMS components are extended and application techniques based on the current semiconductor processing techniques, which has higher flexibility and variety as compared with common IC manufacturing techniques. From the thin film growth, photolithography and exposure as well as dry/wet etching and formation are includes in the applied categories of the MEMS fields. Besides the semiconductor processing techniques, the MEMS techniques additionally integrate with current-developing techniques such as anisotropic etching, electrocasting, LIGA (Lithographie Galvanoformung Abformung), etc.

The LIGA process mainly utilizes optical, electroplating, and molding techniques for manufacturing MEMS components. The LIGA process is an X-ray based photo-etching techniques in which masks or photoresists having patterns are utilized for selectively protecting the surface of the to-be-processed article, and portions not covered by the masks or the photoresists are etched by different light source, and then electrocasting molding and injection molding are applied for obtaining the components with desire geometrical shapes.

As above, according to some embodiment of the instant disclosure, the terminal has a plurality of curved features and locking features to extend the moment arm of the terminal for improving the flexibility of the terminal. The terminal is in contact with the columnar terminal through multiple points (or through the point and the surface), thereby improving the contact stability as well as providing the locking function. Furthermore, by using the MEMS techniques for semiconductor industries, the terminal (female terminal) of micro board-to-board electrical connector can be manufactured; while the terminal of the conventional board-to-board electrical connector is manufactured by stamping or etching which cannot be further minimized. As a result, the application of the terminal of the conventional board-to-board electrical connector is rather limited.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A micro-electro-mechanical systems (MEMS) terminal structure of board-to-board electrical connector, the terminal structure comprising:

a terminal assembled on a surface of a first plate member, wherein the terminal comprises a side arm in which a portion of the side arm is spaced from the surface of the first plate member by a distance, a bent portion formed on a first end of the side arm, and a flexible arm formed on an end portion of the bent portion and located at a side portion of the side arm, wherein the flexible arm comprises a first portion and a second portion, the first portion and the side arm form an insertion space, the second portion and the side arm form a locking space, the second portion of the flexible arm has a contact portion, and the insertion space is greater than the locking space.

2. The MEMS terminal structure according to claim 1, further comprising a columnar terminal, assembled on a second plate member for mating with the terminal, wherein a first side of the columnar terminal is in contact with the contact portion, a second side of the columnar terminal opposite to the first side is in contact with the side arm, and the columnar terminal is locked in the locking space.

3. The MEMS terminal structure according to claim 2, wherein the contact portion is a curved structure and in contact with the first side of the columnar terminal.

4. The MEMS terminal structure according to claim 3, wherein the curved structure is in contact with the first side of the columnar terminal with two points or with a surface.

5. The MEMS terminal structure according to claim 1, wherein the flexible arm is flexibly swingable with the first end of the side arm as a fulcrum.

6. The MEMS terminal structure according to claim 5, wherein an opening is formed between the flexible arm and a second end of the side arm, the second end is opposite to the first end, the locking space is adjacent the opening, and the insertion space is located inside the bent portion.

7. The MEMS terminal structure according to claim 5, wherein an opening is formed between the flexible arm and a second end of the side arm, the second end is opposite to the first end, the insertion space is adjacent the opening, and the locking space is located inside the bent portion.

8. The MEMS terminal structure according to claim 1, wherein the terminal comprises a guiding portion formed on a periphery of the side arm and a periphery of the flexible arm.

9. The MEMS terminal structure according to claim 1, wherein the terminal comprises a contact leg formed on the second end of the side arm.

10. A method of manufacturing micro-electro-mechanical systems (MEMS) terminal structure of board-to-board electrical connector, comprising:

transmitting a terminal shape to a surface of a thick coated layer through a mask, applying lights on the mask to form a recess with a profile of the terminal shape on the thick coated layer, and forming a terminal of a board-to-board electrical connector in the recess by electro-casting, wherein the terminal comprises a side arm, a bent portion, and a flexible arm stacked with each other to form a three-dimensional structure.

* * * * *